US005831989A

United States Patent [19]

Fujisaki

[11] Patent Number: 5,831,989

[45] Date of Patent: Nov. 3, 1998

[54] MEMORY TESTING APPARATUS

[75] Inventor: Kenichi Fujisaki, Gyoda, Japan

[73] Assignee: Advantest Coporation, Tokyo, Japan

[21] Appl. No.: 933,246

[22] Filed: Sep. 18, 1997

[30] Foreign Application Priority Data

Sep. 18, 1996 [JP] Japan .................................... 8-245951

[51] Int. Cl.[6] ...................................................... G06F 11/00

[52] U.S. Cl. ........................................................... 371/21.6

[58] Field of Search ................................ 371/21.6, 21.1, 371/21.2; 365/201; 395/183.18

[56] References Cited

U.S. PATENT DOCUMENTS 4,736,373 4/1988 Schmidt .

5,337,318 8/1994 Tsukakoshi et al. .

FOREIGN PATENT DOCUMENTS 0 424 612 5/1991 European Pat. Off. .

*Primary Examiner*—Vincent P. Canney

*Attorney, Agent, or Firm*—Staas & Halsey

[57] ABSTRACT

There is provided a memory testing apparatus which can read out the information of failure memory cells of a tested memory from a failure analysis memory having the same memory capacity as that of a memory under test and can complete in a short time period the process for computing the classified total of the number of memory cell failures occurred. The memory area of the failure analysis memory is subdivided into a plurality of memory blocks, a flag memory having the same number of addresses as the number of the subdivided memory blocks is provided, and an address is assigned to each of the memory blocks. When a failure occurs in one of the memory blocks, a logical "1" indicating failure information is written at an address of the flag memory corresponding to that memory block. After the test is completed, the address of the flag memory where the logical "1" has been written is detected and the contents of the memory block corresponding to the detected address are read out to compute the classified total of the failure information.

7 Claims, 8 Drawing Sheets

6
5
ADDRESS
FAIL
WRITE
FOM1
FOM2
FOM3
FOM4
FOM5
G1
G2
G3
G4
MUX-A
MUX-B
AFM
FLM
FLM-AP
OR
INV
CLK
RAP
CAP
CS1
CS2
RFC
CFC
TFC
MRFC
MCFC
MTFC
ADD1
ADD2
ADD3
(+1)
A11 ~ A6 C4 ~ C0 A5 ~ A0 R4 ~ R0
A11 ~ A0
R10 ~ R0
C10 ~ C0
ROW ADDRESS
A5 ~ A0 R4 ~ R0
COLUMN ADR
A11 ~ A6 C4 ~ C0
WRITE
FAIL DATA

FIG. 2A

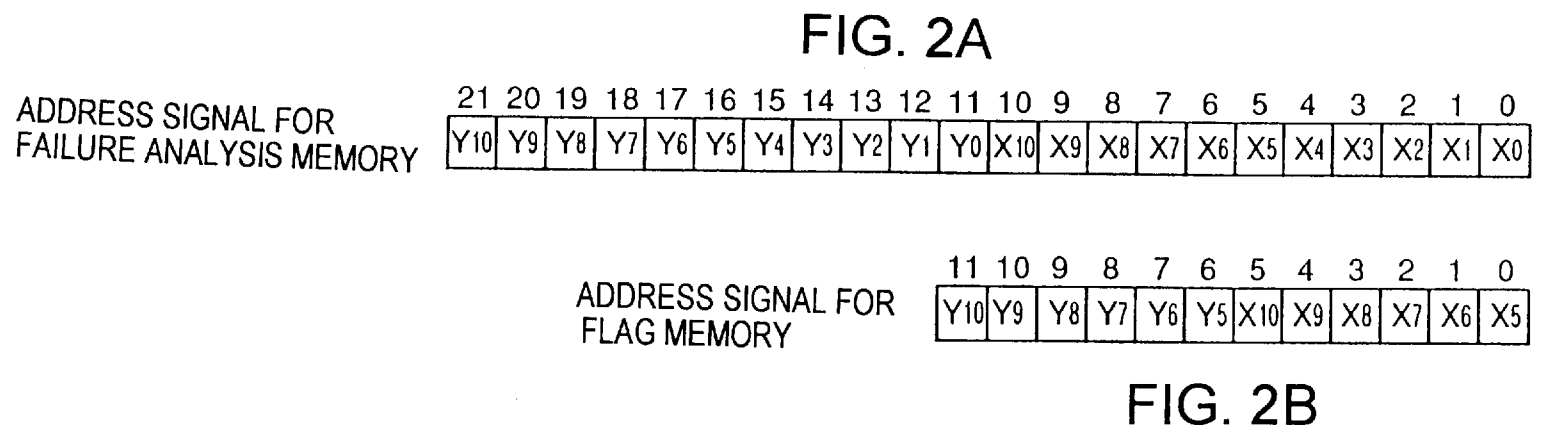

ADDRESS SIGNAL FOR FAILURE ANALYSIS MEMORY

| 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|
| Y10 | Y9 | Y8 | Y7 | Y6 | Y5 | Y4 | Y3 | Y2 | Y1 | Y0 | X10 | X9 | X8 | X7 | X6 | X5 | X4 | X3 | X2 | X1 | X0 |

ADDRESS SIGNAL FOR FLAG MEMORY

| 11 | 10 | 9 | 8 | 7 | 6 | 5 | 4 | 3 | 2 | 1 | 0 |
|---|---|---|---|---|---|---|---|---|---|---|---|
| Y10 | Y9 | Y8 | Y7 | Y6 | Y5 | X10 | X9 | X8 | X7 | X6 | X5 |

FIG. 2B

Figures 4A, 4B, 4C, 4D, 4E, 4F, 4G, 4H:
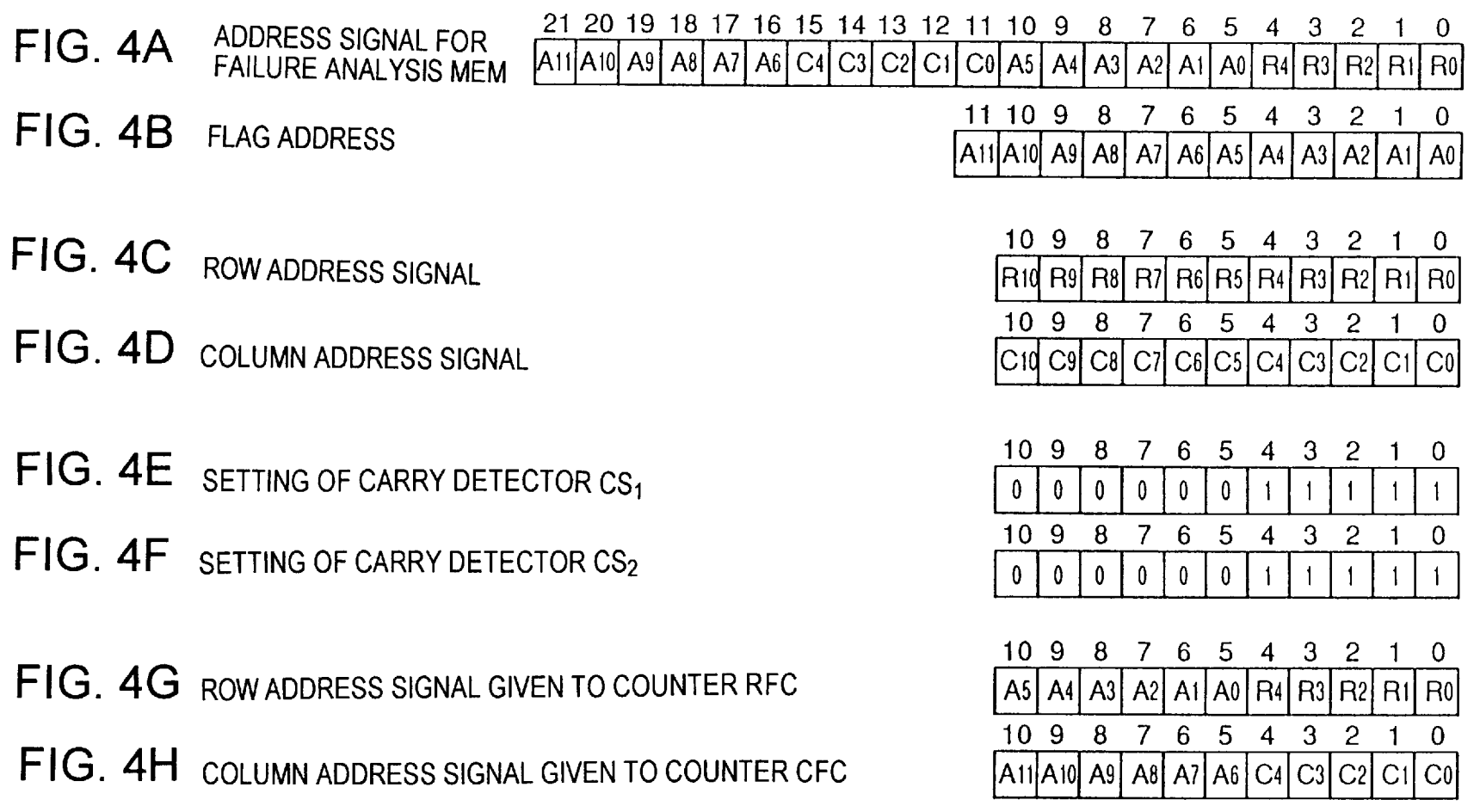

FIG. 4A ADDRESS SIGNAL FOR FAILURE ANALYSIS MEM

| 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|
| A11 | A10 | A9 | A8 | A7 | A6 | C4 | C3 | C2 | C1 | C0 | A5 | A4 | A3 | A2 | A1 | A0 | R4 | R3 | R2 | R1 | R0 |

FIG. 4B FLAG ADDRESS

| 11 | 10 | 9 | 8 | 7 | 6 | 5 | 4 | 3 | 2 | 1 | 0 |
|---|---|---|---|---|---|---|---|---|---|---|---|
| A11 | A10 | A9 | A8 | A7 | A6 | A5 | A4 | A3 | A2 | A1 | A0 |

FIG. 4C ROW ADDRESS SIGNAL

| 10 | 9 | 8 | 7 | 6 | 5 | 4 | 3 | 2 | 1 | 0 |
|---|---|---|---|---|---|---|---|---|---|---|
| R10 | R9 | R8 | R7 | R6 | R5 | R4 | R3 | R2 | R1 | R0 |

FIG. 4D COLUMN ADDRESS SIGNAL

| 10 | 9 | 8 | 7 | 6 | 5 | 4 | 3 | 2 | 1 | 0 |
|---|---|---|---|---|---|---|---|---|---|---|
| C10 | C9 | C8 | C7 | C6 | C5 | C4 | C3 | C2 | C1 | C0 |

FIG. 4E SETTING OF CARRY DETECTOR $CS_1$

| 10 | 9 | 8 | 7 | 6 | 5 | 4 | 3 | 2 | 1 | 0 |
|---|---|---|---|---|---|---|---|---|---|---|
| 0 | 0 | 0 | 0 | 0 | 0 | 1 | 1 | 1 | 1 | 1 |

FIG. 4F SETTING OF CARRY DETECTOR $CS_2$

| 10 | 9 | 8 | 7 | 6 | 5 | 4 | 3 | 2 | 1 | 0 |
|---|---|---|---|---|---|---|---|---|---|---|
| 0 | 0 | 0 | 0 | 0 | 0 | 1 | 1 | 1 | 1 | 1 |

FIG. 4G ROW ADDRESS SIGNAL GIVEN TO COUNTER RFC

| 10 | 9 | 8 | 7 | 6 | 5 | 4 | 3 | 2 | 1 | 0 |
|---|---|---|---|---|---|---|---|---|---|---|
| A5 | A4 | A3 | A2 | A1 | A0 | R4 | R3 | R2 | R1 | R0 |

FIG. 4H COLUMN ADDRESS SIGNAL GIVEN TO COUNTER CFC

| 10 | 9 | 8 | 7 | 6 | 5 | 4 | 3 | 2 | 1 | 0 |
|---|---|---|---|---|---|---|---|---|---|---|
| A11 | A10 | A9 | A8 | A7 | A6 | C4 | C3 | C2 | C1 | C0 |

MEMORY TESTING APPARATUS

BACKGROUND OF THE INVENTION

1. Field of the Invention

The present invention relates to a memory testing apparatus for testing a memory element in the form of a semiconductor integrated circuit (a semiconductor integrated circuit memory element, hereinafter referred to as IC memory), and particularly, relates to an improvement in a memory testing apparatus provided with a failure relief analyzer which counts the number of failure memory cells in a tested IC memory and determines whether or not the IC memory can be relieved.

2. Description of the Related Art

Storage capacity of an IC memory is increasing more and more, and accordingly an increased IC chip area and formation of patterns at high density are required. As a result, there is an increased possibility that a reduction of the yield of IC memories caused by a very minute defect occurs. In order to prevent the yield of IC memories from being reduced, there are manufactured IC memories in each of which, for example, one or more failure memory cells can be electrically replaced by a substitute or alternative memory cell (also called a spare line, relief line or redundancy circuit). As will be described later, the IC memory of this kind is called a memory of redundancy structure in this technical field, and a decision as to whether or not the redundancy-structured memory can be relieved is rendered by a failure relief analyzer.

FIG. 5 shows a block diagram of a general construction of an example of a prior memory testing apparatus having a conventional failure relief analyzer. As is well known, this memory testing apparatus comprises a timing generator 1, a pattern generator 2, a waveform shaping device 3, a logical comparator 4, a failure analysis memory 5 and a failure relief analyzer 6.

The timing generator 1 generates a reference clock (REF CLK). When the reference clock is supplied to the pattern generator 2, the pattern generator 2 operates to generate an address signal, a data signal and a control signal which are to be applied to an IC memory to be tested or under test (hereinafter simply referred to as memory to be tested or under test) MUT. The pattern generator 2 also generates an expected value data signal which is to be supplied to the logical comparator 4. The address signal, the data signal and the control signal are inputted to the waveform shaping device 3 where those signals are shaped to have waveforms required to test a memory to be tested MUT, and then are applied to the memory under test MUT as a predetermined test pattern signal.

The data signal written in the memory under test MUT is temporarily stored therein and is read out therefrom later. The read-out data signal is inputted to the logical comparator 4. An expected value data signal is supplied from the pattern generator 2 to the logical comparator 4 where the data signal inputted thereto from the memory under test MUT is logically compared with the expected value data signal to detect as to whether or not there is an anti-coincidence or mismatch between both signals.

If the data signal does not coincide with the expected value data signal, the logical comparator 4 outputs a failure signal (failure data) to write and store it in the failure analysis memory 5 at an address thereof specified by the address signal generated from the pattern generator 2. Usually, when the data signal coincides with the expected value data signal, the logical comparator 4 generates a pass signal which is not stored in the failure analysis memory 5.

In such a way, the information on failure memory cells of a memory under test MUT generated during a series of tests is stored in the failure analysis memory 5. After the test is completed, the failure analysis for the memory under test MUT is carried out with reference to the failure data stored in the failure analysis memory 5.

The failure analysis memory 5 has the same operating rate or speed and storage capacity as those of the memory under test MUT, and the same address signal as that applied to the memory under test MUT is applied to the failure analyses memory 5. In addition, the failure analysis memory 5 is initialized prior to the start of a test. For example, when initialized, the failure analysis memory 5 has data of logical "0s" written in all of the addresses thereof. Every time a failure data indicating the anti-coincidence is generated from the logical comparator 4 during a test of a memory under test MUT, a failure data of, for example, logical "1" indicating failure of a memory cell is written in the same address of the failure analysis memory 5 as that of the memory cell which has generated the anti-coincidence.

The failure relief analyzer 6 separately and simultaneously counts the total number of failure cells stored in the failure analysis memory 5 and the number of failure cells on each address line (row address lines and column address lines) stored in the failure analysis memory 5, and analyzes to determine whether the relief of the tested memory is possible or not by use of relief lines, i.e., spare memory cells (spare lines or redundancy circuits) provided in the tested memory MUT. A memory having such relief lines is, as mentioned above, called a redundancy-structured memory in this technical field.

Here, a brief explanation will be given regarding a redundancy-structured memory. FIG. 6 shows in outline an arrangement of an example of such redundancy-structured memories. A memory to be tested MUT has, in addition to a memory cell array (main storage portion) MCA where memory cells are arrayed in rows (lateral rows) and columns (longitudinal rows), row address relief lines SR and column address relief lines SC formed on the periphery of the memory cell array MCA. The memory cell array MCA, the row address relief lines SR and the column address relief lines SC are formed in the same semiconductor chip. In this example, there is shown a case where two row address relief lines SR are disposed along one side of the row address direction of the memory cell array MCA and two column address relief lines SC are disposed along one side of the column address direction of the memory cell array MCA, respectively. However, it is needless to say that the number of relief lines and the positions where those relief lines are disposed are not limited to the example as illustrated.

As a result of the test of a memory to be tested MUT, in case that three failure memory cells $X_1$, $X_2$ and $X_3$ are detected, for example, on the i-th row address line Ri (i is an integer) and three failure memory cells $Y_1$, $Y_2$ and $Y_3$ are detected, for example, on the i-th column address line Ci, if the row address line Ri is substituted by any one of the row address relief lines SR with respect to its electrical connection, the row address line Ri having the failure cells can be relieved. Similarly, if the column address line Ci is substituted by any one of the column address relief lines SC with respect to its electrical connection, the column address line Ci having the failure cells can also be relieved.

In such a way, a redundancy-structured memory is arranged such that failure memory cells in its memory cell array MCA can be relieved by its row and column address relief lines. Therefore, by counting the number of failure memory cells of each row address line and the number of failure memory cells of each column address line and by comparing the number of row and column address lines each having failure cells with the number of relief lines, a decision can be rendered as to whether the memory cell array MCA can be relieved or not.

For this reason, as shown in FIG. 7, in the conventional failure relief analyzer 6 the number of failure memory cells in each row address line within the memory cell array MCA is counted by a row address failure counter RFC and the number of failure memory cells in each column address line within the memory cell array MCA is counted by a column address failure counter CFC, and in addition, the total number of failure memory cells are counted by a total failure counter TFC. Then, based upon those counted values, the possibility of relief of the memory cell array MCA is determined.

FIG. 8 shows a block diagram of an arrangement of an example of the conventional failure analysis memory 5 and a block diagram of an arrangement of an example of the conventional failure relief analyzer 6. The failure analysis memory 5 comprises an address formatter $FOM_1$ for matching an address of a failure memory cell in a memory under test MUT with an address of the failure analysis memory 5 in which the failure signal indicating the failure memory cell is stored, and a memory part AFM for storing a failure signal supplied from the logical comparator 4 shown in FIG. 5 at an address specified by an address signal formatted by the address formatter $FOM_1$. The address formatter $FOM_1$ formats an address signal for accessing the memory part AFM based on, for example, a row address signal Xi (i is an integer) and a column address signal Yi (i is an integer) (in the illustrated example, each address signal has 11 bits of 0–10) as shown in FIG. 9 supplied from the pattern generator 2 (see FIG. 5), thereby to access the same address of the memory part AFM of the failure analysis memory 5 as that of the memory under test MUT which is accessed by the row and column address signals. By such arrangement, at the same address of the memory part AFM as that of the memory under test MUT where a failure memory cell has occurred can be stored the corresponding failure signal indicating that failure memory cell.

A failure signal is supplied to one input terminal of a gate G1 of the failure analysis memory 5 from the logical comparator 4 shown in FIG. 5. A write timing signal WRITE is applied to the other input terminal of the gate G1. The failure signal is supplied to a write clock input terminal WE of the memory part AFM only when the write timing signal WRITE is applied to the gate G1 (at the timing of the write timing signal).

During the time duration that data signal temporarily stored in the memory under test MUT are read out therefrom, the write timing signal WRITE is applied to the gate G1, and a logical "1" signal is always supplied to a data input terminal Di of the memory part AFM of the failure analysis memory 5. Therefore, since the memory part AFM is accessed, every time a failure signal of logical "1" is outputted from the logical comparator 4, by an address signal which is the same as the address signal supplied to the memory under test MUT at that time, the failure data of logical "1" is written at the same address of the memory part AFM as the address of the memory under test MUT. Consequently, when the test is completed, the failure data each having a logical "1" are written at the same addresses of the memory part AFM as those of all the memory cells where failures occurred.

The failure relief analyzer 6 comprises a row address generator RAP, a column address generator CAP, a carry detector CS1 for detecting when the row address generator RAP has generated all the addresses in one row and outputting a carry signal, a row address failure counter RFC for counting the number of failure memory cells in each row address line, a column address failure counter CFC for counting the number of failure memory cells in each column address line, a total failure counter TFC for counting the total number of failure memory cells, and a gate G2 for controlling the writing of failure data.

The row address generator RAP and the column address generator CAP generate row address signals $R_0$–$R_{10}$ (corresponding to the row address signals Xi shown in FIG. 9) and column address signals $C_0$–$C_{10}$ (corresponding to the column address signals Yi shown in FIG. 9), respectively, in synchronism with a clock CLK. These row address signals $R_0$–$R_{10}$ and column address signals $C_0$–$C_{10}$ are inputted to the row address failure counter RFC and the column address failure counter CFC, respectively.

The row address failure counter RFC comprises a memory $M_{RFC}$ which is accessed by a row address signal and stores a failure data at the accessed address thereof and an adder $ADD_1$ for adding one (1) to the number of failure data (number of failures occurred) read out from the memory $M_{RFC}$.

The column address failure counter CFC comprises a memory $M_{CFC}$ which is accessed by a column address signal and stores a failure data at the accessed address thereof and an adder $ADD_2$ for adding one (1) to the number of failure data (number of failures occurred) read out from the memory $M_{CFC}$.

Further, the total failure counter TFC comprises a memory $M_{TFC}$ for merely storing the total number of failure memory cells at the same address, and an adder $ADD_3$ for adding one (1).

The carry detector CS1 outputs a carry signal every time all bits of the row address signal outputted from the row address generator RAP become logical "1s", and supplies the carry signal to the column address generator CAP. The column address generator CAP increases or increments the column address by one (+1) every time a carry signal is received.

Every time a row address signal and a column address signal are inputted to the respective memories $M_{RFC}$ and $M_{CFC}$ to specify a row address and a column address of those memories respectively, the respective numbers of the failure memory cells stored in the specified row address and the specified column address are read out from those memories $M_{RFC}$ and $M_{CFC}$ and are supplied to the corresponding adders $ADD_1$ and $ADD_2$, respectively. Each of those adders $ADD_1$ and $ADD_2$ adds 1 (one) to the value read out from the corresponding one of the memories $M_{RFC}$ and $M_{CFC}$, and supplies the summed value to the input terminal Di of the corresponding one of the memories $M_{RFC}$ and $M_{CFC}$.

When a failure data is read out from the failure analysis memory 5 in the state that the summed results of the adders $ADD_1$ and $ADD_2$ are being supplied to the input terminals Di of the respective memories $M_{RFC}$ and $M_{CFC}$, the failure data is supplied to one input terminal of the gate G2, and is inputted to respective write clock input terminals WE of the memories $M_{RFC}$ and $M_{CFC}$ at the timing of the write timing signal WRITE supplied to the other input terminal of the gate G2. As a result, the respective summed results at their input terminals Di are written at the addresses of the memories $M_{RFC}$ and $M_{CFC}$ being accessed by the row address signal and the column address signal, respectively.

That is, the summed results of the adders $ADD_1$ and $ADD_2$ (values obtained by adding 1 (one) to the values read out from the respective memories $M_{RFC}$ and $M_{CFC}$) are written in the corresponding memories $M_{RFC}$ and $M_{CFC}$ only when a failure data is read out from the failure analysis memory 5. If no failure data is read out from the failure analysis memory 5, those summed results are not written in the respective memories $M_{RFC}$ and $M_{CFC}$. Therefore, the numbers of failure memory cells are accumulated row by row and column by column, and stored in the respective counters RFC and CFC for each of the row addresses and for each of the column addresses, respectively.

Further, the total failure counter TFC is arranged such that each time a failure data is read out from the failure analysis memory 5, the number of the failure data is accumulated and the accumulated value is stored in the same address.

As mentioned above, when the number of failure memory cells is counted in the failure relief analyzer 6 separately for each row address and each column address, in the conventional failure relief analyzer, the entire memory area of the memory part AFM which is a component of the failure analysis memory 5 is accessed for reading out the failure data stored in the memory part AFM. That is, in the conventional failure relief analyzer, the memory area from the first address to the last address of each of all rows and each of all columns of the memory part AFM is entirely read. Therefore, with the increase of storage capacity of a memory under test in recent years, there was a problem that it took a very long time for reading out the failure data, and hence a very long time was required for the failure relief process.

SUMMARY OF THE INVENTION

It is an object of the present invention to provide a memory testing apparatus having a failure relief analyzer which can compute the classified total of the number of failure memory cells in a memory under test in a short time period even if the storage capacity of the memory under test is large.

In one aspect of the present invention, there is provided a memory testing apparatus comprising: a failure analysis memory having the same storage capacity as that of a memory under test, and being accessed by the same address signal as that which is applied to the memory under test, the failure analysis memory storing, each time a failure memory cell is detected from the memory under test, failure memory cell information written at the same address of the failure analysis memory as that of the memory under test in which that failure memory cell resides; and a failure relief analyzer for accessing all of the addresses of the failure analysis memory to read out the stored failure memory cell information therefrom after completion of the test, and computing position information in which the failure memory cell or cells reside and the total number of the failure memory cells, thereby to determine whether the relief of the tested memory is possible or not on the basis of the position information and the total number of the failure memory cells, the memory testing apparatus being characterized by: means for subdividing the failure analysis memory into a plurality of memory blocks; a flag memory having its addresses corresponding to the subdivided memory blocks respectively, and storing at an address thereof corresponding to a memory block a flag representing that failure memory cell information has been written in that memory block; address formatting means for taking out several bits from an address signal applied to the failure analysis memory, thereby to create an address signal for accessing all of the addresses of the flag memory, when testing a memory under test; and computing means for accessing all of the addresses of the flag memory to read out the stored flag therefrom after completion of the test, and reading out only the stored contents of one or more memory blocks of the failure analysis memory corresponding to the address or addresses of the read-out one or more flags to compute position information of the failure memory cell or cells, and the above object is attained.

In a preferred embodiment of the invention, the computing means comprises: a row address generator for generating the same row address signal as a row address signal of an address signal applied to the failure analysis memory; a column address generator for generating the same column address signal as a column address signal of the address signal applied to the failure analysis memory; a flag address generator for generating a flag address signal for accessing all of the addresses of the flag memory after completion of the test; second address formatting means for creating an address signal for accessing all of the addresses of one or more memory blocks corresponding to the address or addresses of one or more flags read out from the flag memory on the basis of the output signals from the flag address generator, the row address generator and the column address generator; row failure cell storage means for storing therein the failure memory cell information relating to row addresses of failure memory cell information read out, after completion of the test, from one or more memory blocks in which failure memory cell information has been written; column failure cell storage means for storing therein the failure memory cell information relating to column addresses of the failure memory cell information read out, after completion of the test, from the one or more memory blocks in which failure memory cell information has been written; third address formatting means for creating an address signal for accessing all of the addresses of the row failure cell storage means on the basis of the output signals from the flag address generator and the row address generator; and fourth address formatting means for creating an address signal for accessing all of the addresses of the column failure cell storage means on the basis of the output signals from the flag address generator and the column address generator.

The memory testing apparatus described above further includes means for storing therein the total number of failure memory cells read out from one or more memory blocks in which failure memory cell information has been written.

In addition, in a preferred embodiment of the invention, the flag memory is arranged such that when testing a memory under test, it is accessed by an address signal created by the address formatting means whereby a logical value representing a flag is written at an address of the flag memory being accessed by the address signal each time failure cell information is written in the failure analysis memory, and the address formatting means takes out most significant several bits from a row address signal and most significant several bits from a column address signal of an address signal applied to the failure analysis memory, respectively, thereby to create an address signal for accessing all of the addresses of the flag memory.

It is preferred that the storage capacity of the flag memory is selected between one in several tens (1/several tens) and one in several thousand (1/several thousand) of that of the failure analysis memory.

According to the present invention, an address area of a failure analysis memory is subdivided into a plurality of memory blocks and a flag indicating whether or not one or more failure data were written in each of the subdivided memory blocks during the test is stored in a flag memory. Each address of the flag memory corresponds to each memory block which is a subdivided memory block of the failure analysis memory. As a result, the presence or absence of failure information in each memory block can be known depending on the state of the flag stored in each address of the flag memory.

Consequently, at the time of the failure relief analysis, it is not necessary to read the address area within a memory block of the failure analysis memory corresponding to an address in which a flag is not stored. Therefore, by detecting the addresses in each of which a flag is stored (for example, a logical "1" is stored), the address areas of those memory blocks corresponding to those addresses of the flag memory may only be read out. Therefore, the area of the failure analysis memory from which the failure data are to be read can significantly be reduced and hence the failure relief processing time can significantly be reduced.

BRIEF DESCRIPTION OF THE DRAWINGS

FIGS. 2A and 2B are general diagrams for explaining the operation of the memory testing apparatus shown in FIG. 1;

FIGS. 4A through 4H are general diagrams for explaining the operation of the memory testing apparatus shown in FIG. 1;

DETAILED DESCRIPTION OF THE PREFERRED EMBODIMENTS

Figure 1:
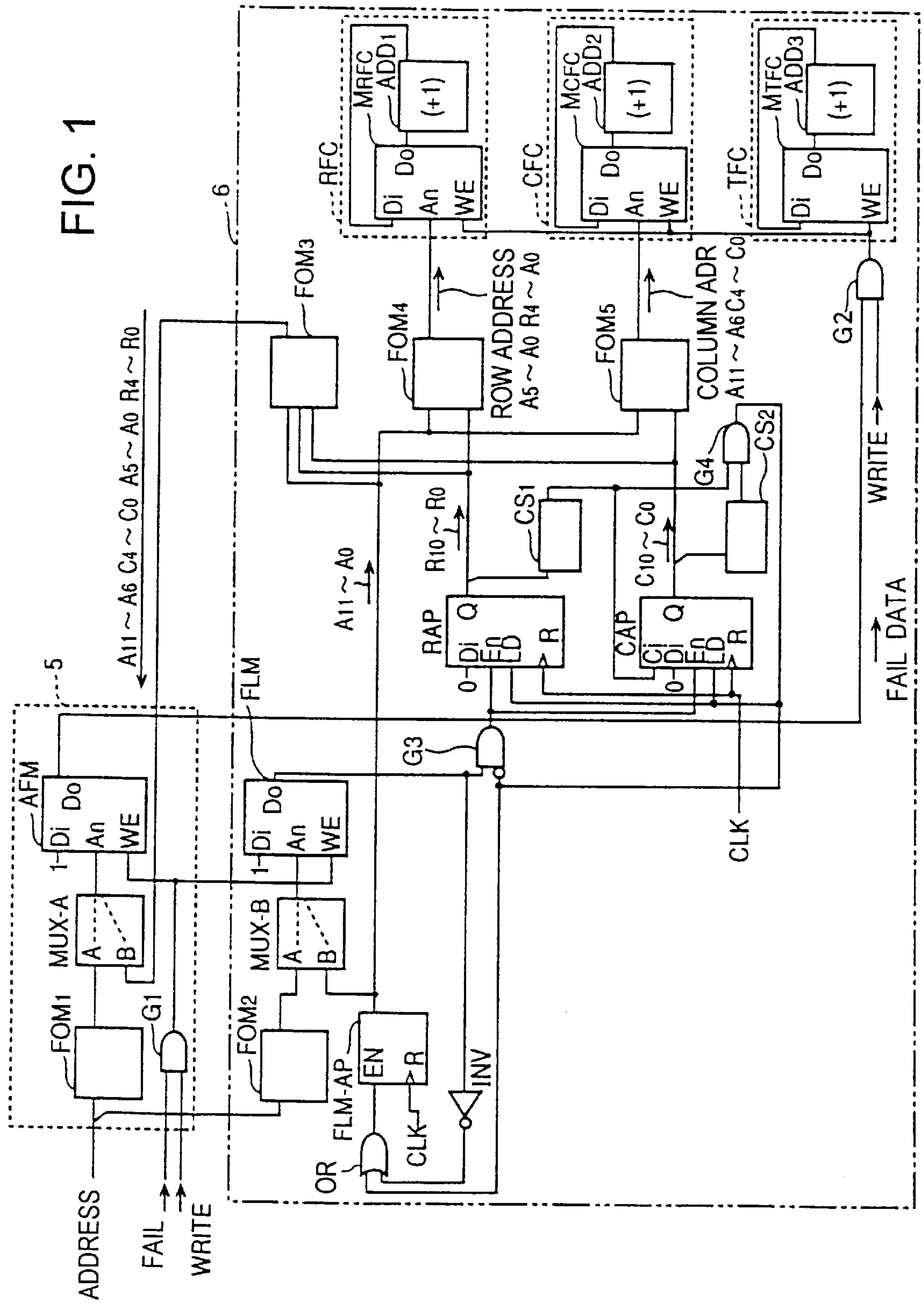
FIG. 1 is a block diagram showing the construction of an essential portion of an embodiment of a memory testing apparatus according to the present invention.
Figure 8:
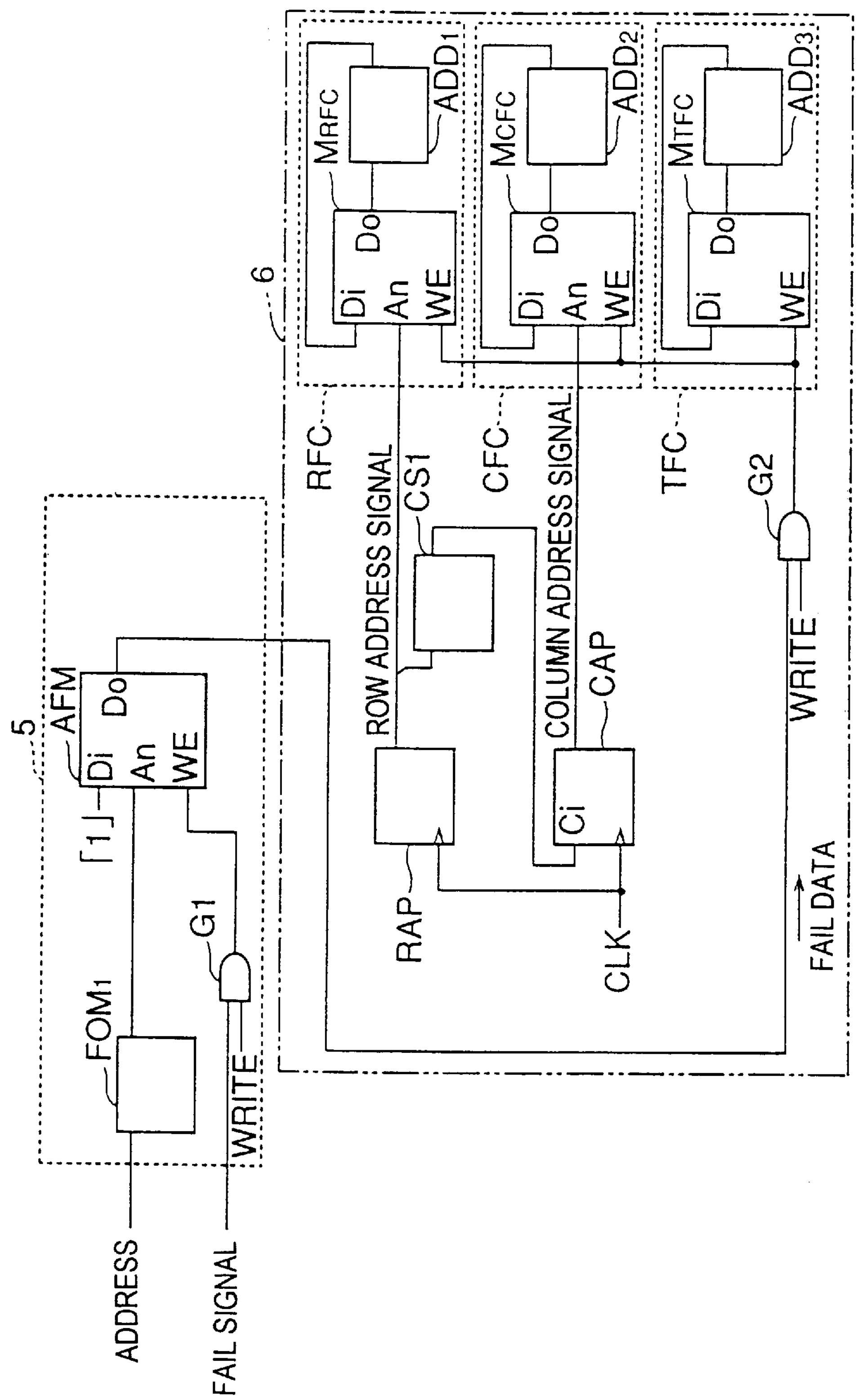
FIG. 8 is a block diagram for explaining the construction and the operation of a conventional failure relief analyzer.
Figure 9:
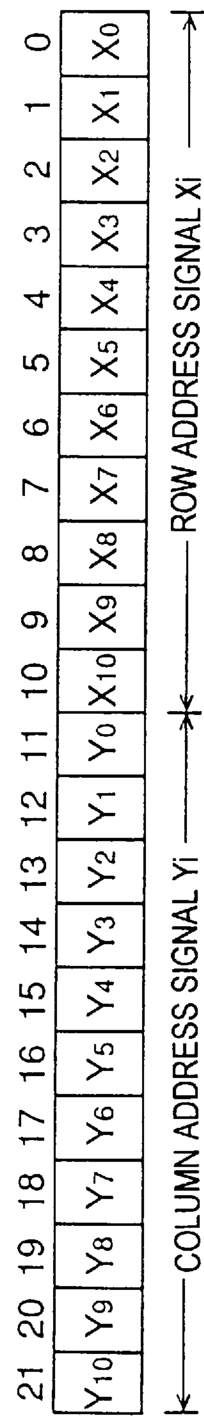
FIG. 9 is a general diagram for explaining the operation of the failure relief analyzer shown in FIG. 8.

FIG. 1 is a block diagram showing the construction of a failure analysis memory and a failure relief analyzer which are essential portions of an embodiment of the memory testing apparatus provided with the failure relief analyzer according to the present invention. Further, in order to simplify the explanation, the same reference characters are affixed to the portions corresponding to those in FIG. 8 and the explanation thereof is omitted unless it is required.

Figure 5:
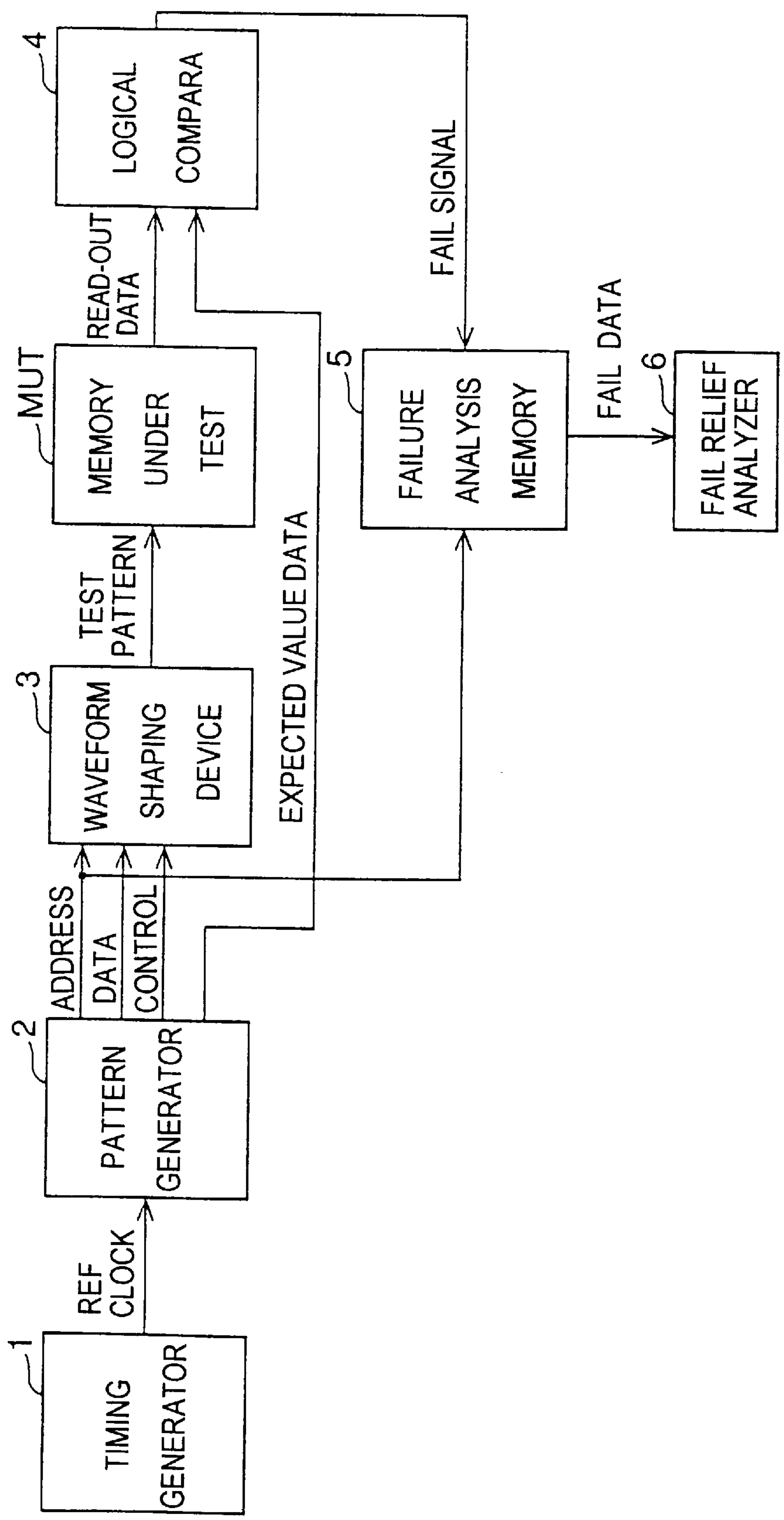
FIG. 5 is a block diagram showing the construction of an example of a conventional memory testing apparatus having a failure relief analyzer.
Figure 6:
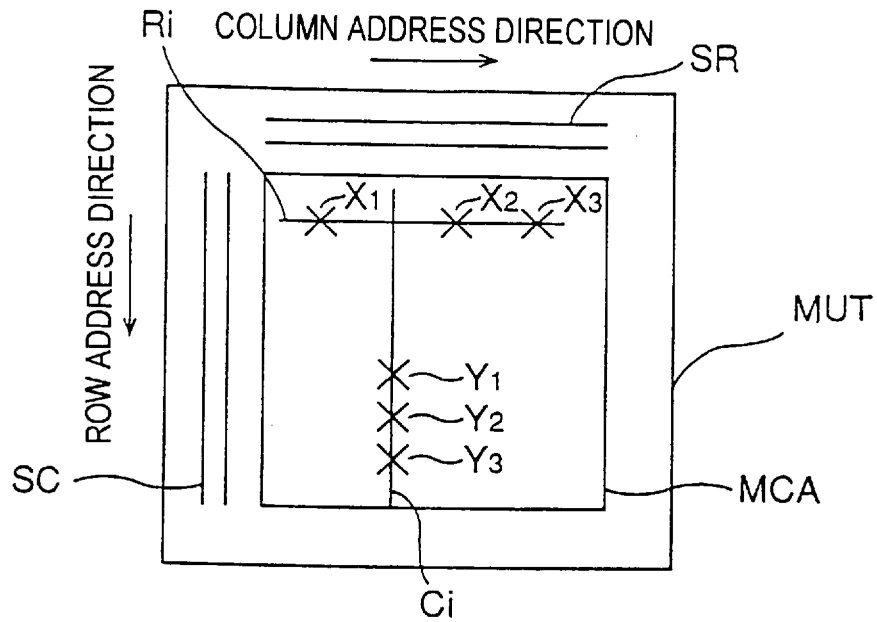
FIG. 6 is a general diagram for explaining an example of a failure relieving method of a memory under test.
Figure 7:
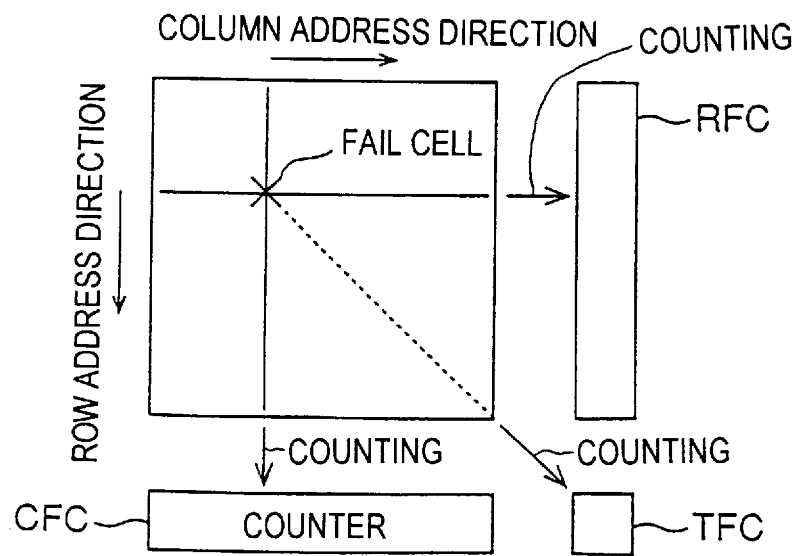
FIG. 7 is a diagram for explaining an example of a conventional method for computing the classified total of the data required for failure relief of a memory under test.

In this embodiment, a failure analysis memory 5 also includes an address formatter $FOM_1$ for matching an address of a failure memory cell in a memory under test MUT with an address of the failure analysis memory 5 at which a failure signal indicating that failure memory cell is stored, and a memory part AFM for storing a failure signal supplied from the logical comparator 4 shown in FIG. 5 at an address of the memory part AFM specified by an address signal formatted by the address formatter $FOM_1$.

In addition, the failure analysis memory 5 is constructed such that a first multiplexer MUX-A is inserted between the address formatter $FOM_1$ and the memory part AFM so that an output signal of the address formatter $FOM_1$ and an output signal of an address formatter $FOM_3$ which is to be explained later are selectively switched to be supplied to the memory part AFM.

The address formatter $FOM_1$ formats an address signal for accessing the memory part AFM based on a row address signal Xi (i is an integer) and a column address signal Yi (i is an integer) and supplies the address signal to the memory part AFM of the failure analysis memory 5 via the first multiplexer MUX-A so that the address of the memory part AFM which is same as the accessed address of the memory under test is accessed. By this operation, a corresponding failure signal can be stored in the address of the memory part AFM which is the same address as the address of the memory under test MUT where a failure cell is detected.

In the present invention, the memory part AFM of the failure analysis memory 5 whose memory capacity is equal to that of the memory under test is subdivided into a plurality of memory blocks. In addition, there are provided in the failure relief analyzer 6 a flag memory FLM for storing flags corresponding to the respective subdivided memory blocks and a second address formatter $FOM_2$ for formatting an address signal for accessing the flag memory FLM. Further, the failure relief analyzer 6 is constructed such that a second multiplexer MUX-B is inserted between the second address formatter $FOM_2$ and the flag memory FLM, and an output signal of the address formatter $FOM_2$ and an output signal of a flag address generator FLM-AP which is to be explained later are selectively switched by the second multiplexer MUX-B to be supplied to the flag memory FLM.

The number of subdivided memory blocks of the memory part AFM of the failure analysis memory 5 is equal to the number of flags which can be stored in the flag memory FLM of the failure relief analyzer 6.

In addition, the failure relief analyzer 6 further includes a flag address generator FLM-AP for generating an address signal for accessing the flag memory FLM, a third address formatter $FOM_3$ for formatting, based on output signals of the flag address generator FLM-AP, the row address generator RAP and the column address generator CAP, an address for accessing the memory part AFM which is required at the time of the failure relief process, a fourth address formatter $FOM_4$ for formatting, based on output signals of the flag address generator FLM-AP and the row address generator RAP, an address for accessing the row address failure counter RFC, and a fifth address formatter $FOM_5$ for formatting, based on output signals of the flag address generator FLM-AP and the column address generator CAP, an address for accessing the column address failure counter CFC.

A failure signal is supplied to one input terminal of the gate G1 of the failure analysis memory 5 from the logical comparator 4 shown in FIG. 5. A write timing signal WRITE is applied to the other input terminal of the gate G1 and at the timing of the write timing signal WRITE, the failure signal is supplied to a write clock input terminal WE of the memory part AFM and to a write clock input terminal WE of the flag memory FLM of the failure relief analyzer 6.

Next, an explanation on an example of the relationship between the number of subdivided memory blocks of the memory part AFM and the number of flags stored in the flag memory FLM will be given with reference to FIG. 2.

FIG. 2A shows a row address signal Xi (i is an integer) and a column address signal Yi (i is an integer) to be supplied to the first address formatter $FOM_1$ of the failure analysis memory 5 from the pattern generator 2 (refer to FIG. 5). In this example, a memory under test has a storage capacity of 4M bits and the number of addresses is assumed to be $2^{11}$ (2048) in the row direction, $2^{11}$ (2048) in the column direction, and the total $2^{11}\times2^{11}$=4194304. Therefore, the memory part AFM of the failure analysis memory 5 also has an address area of $2^{11}$ in the row direction, $2^{11}$ in the column direction, and the total 4194304. (Exactly speaking, each of a memory under test and the failure analysis memory 5 has a storage capacity of 4.19430M bits.)

In this embodiment, the memory part AFM of the failure analysis memory 5 is subdivided into memory blocks of $2^6$ in the row direction, $2^6$ in the column direction, and the total 4096 ($2^6\times2^6$) memory blocks. Therefore, as will be understood from the equation below, each memory block has 4194304 (bits)÷4096=1024 (bits) i.e., 1024 addresses (a storage capacity of 1024 bits).

FIG. 2B shows an example of an address signal to be supplied to the flag memory FLM (hereinafter referred to as a flag address signal). The 11 bit row address signal of $X_0$–$X_{10}$ and the 11 bit column address signal of $Y_0$–$Y_{10}$ supplied to the first address formatter $FOM_1$ are also supplied to the second address formatter $FOM_2$ in the failure relief analyzer 6. In this example, the second address formatter $FOM_2$ selects the most significant six bits from each of the row address signal of $X_0$–$X_{10}$ and the column address signal of $Y_0$–$Y_{10}$, and then formats an address signal for accessing the flag memory FLM based on the six bit row address signal of $X_5$–$X_{10}$ and the six bit column address signal of $Y_5$–$Y_{10}$ to supply it to the flag memory FLM via the second multiplexer MUX-B as a flag address signal.

That is, since the memory part AFM of the failure analysis memory 5 is, in this example, subdivided into 4096 memory blocks, the flag memory FLM also requires the address capacity of 4096 addresses in order to store the flags of respective memory blocks. Therefore, as mentioned above, the second address formatter $FOM_2$ formats 4096 address signals for accessing the flag memory FLM based on the six bit row address signal of $X_5$–$X_{10}$ and the six bit column address signal of $Y_5$–$Y_{10}$.

As mentioned above, since the storage capacity of a memory block of the memory part AFM is 1024 addresses ($2^5\times2^5$), the failure information of a memory under test MUT having a storage capacity of 4M bits (4194304 bits) can be compressed to 4096 flags and stored in the flag memory.

Figure 3A:
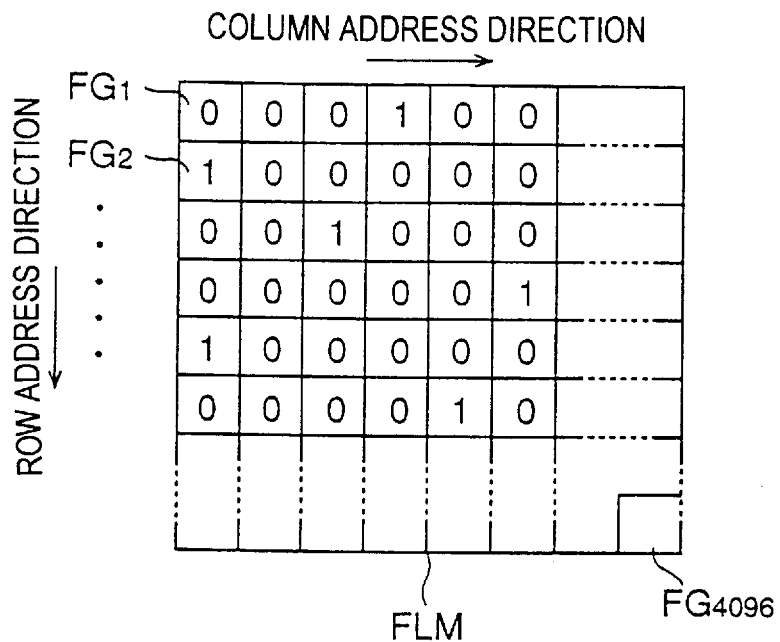
FIGS. 3A and 3B are general diagrams for explaining the construction of an essential portion of the memory testing apparatus shown in FIG. 1.

Next, the above operations will be explained with reference to FIG. 3. FIG. 3A shows an internal structure of the flag memory FLM. As described above, the flag memory FLM has $2^6$ (64) addresses in the row direction, $2^6$ (64) addresses in the column direction, and total 4096 addresses. In FIG. 3A, one of the sections ($FG_1$, $FG_2$, . . . $FG_{4096}$) indicates one bit of the flag memory and those flag memory cells ($FG_1$–$FG_{4096}$) are provided corresponding to the respective 4096 address positions.

Figure 3B:
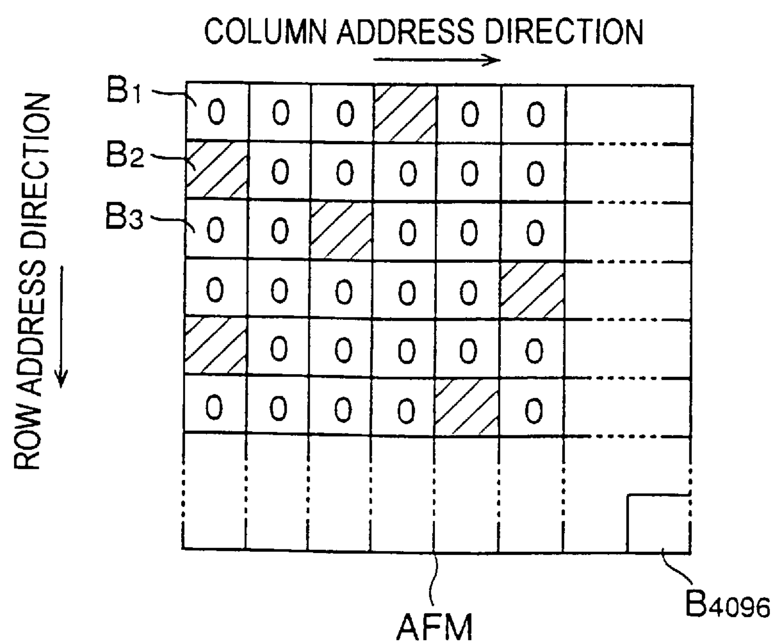

FIG. 3B shows an internal structure of the memory part AFM. As described above, the memory part AFM is subdivided into $2^6$ (64) in the row direction, $2^6$ (64) in the column direction, and total 4096 memory blocks $B_1$–$B_{4096}$. Each of the memory blocks $B_1$, $B_2$, $B_3$, . . . $B_{4096}$ has a memory capacity of 1024 addresses. In FIG. 3B, each of the memory blocks hatched by slant lines indicates a memory block in which failure information is written. Therefore, as shown in FIG. 3A, a flag of logical "1" is written in a flag address corresponding to a memory block hatched by slant lines.

Therefore, at the time of the memory test, since the first multiplexer MUX-A and the second multiplexer MUX-B shown in FIG. 1 select the output signal of the first address formatter $FOM_1$ and the output signal of the second address formatter $FOM_2$, respectively, a row address signal of 11 bits and a column address signal of 11 bits outputted from the pattern generator 2 (refer to FIG. 5) are supplied in untouched state to the memory part AFM of the failure analysis memory 5, and a row address signal having the most significant six bits of the 11 bit row address signal and a column address signal having the most significant six bits of the 11 bit column address signal are supplied to the flag memory FLM of the failure relief analyzer 6.

If a failure occurs during a memory test, the failure signal is written in an address of the memory part AFM which is the same address as that of the memory under test MUT. However, in the case of the flag memory FLM, a flag of logical "1" is written in a flag address determined by a row address signal and a column address signal each having most significant six bits of the address of the memory under test MUT where the failure occurred.

At the time of the failure relief analysis, the first multiplexer MUX-A selects the address signal formatted by the third address formatter $FOM_3$ to supply it to the memory part AFM, and the second multiplexer MUX-B selects the 12 bit flag address signal outputted from the flag address generator FLM-AP to supply it to the flag memory FLM.

The flag address generator FLM-AP outputs in order the 12 bit flag address signals of $A_0$–$A_{11}$ shown in FIG. 4B starting from the first address 1 to the last address 4096 in synchronism with the supply of a clock CLK. Those flag address signals access the flag memory FLM via the second multiplexer MUX-B. Since the output signal of the flag memory FLM is supplied to an enable terminal EN of the flag address generator FLM-AP via an invertor INV and a logical gate OR, if a data value read out from the flag memory FLM is logical "0", an operation to increment the flag address by 1 is repeated.

On the other hand, if a data of logical "1" is read out from the flag memory FLM, the data of logical "1" i.e., a flag signal is supplied to the enable terminal EN of the flag address generator FLM-AP via the invertor INV and the logical gate OR. As a result, the flag address generator FLM-AP stops its operation and the flag memory FLM is held in the state that a flag signal of logical "1" is outputted therefrom.

The output terminal of the flag memory FLM is also coupled to a non-inverting input terminal of a gate G3 and an output terminal of a gate G4 is coupled to an inverting input terminal of the gate G3. The gate G4 supplies a logical "1" output to the inverting input terminal of the gate G3 only when carry signals are outputted from both of the first and the second carry detectors CS1 and CS2. Otherwise, the gate G4 supplies a logical "0" output to the inverting input terminal of the gate G3. Therefore, when carry signals are not outputted from both of the first and the second carry detectors CS1 and CS2, an inverted input of the gate G3 is a logical "1". When a flag signal of logical "1" is read out from the flag memory FLM in this state, the output of the gate G3 is inverted to logical "1".

The logical "1" output signal from the gate G3 is supplied to enable terminals EN of the row address generator RAP and the column address generator CAP. As a result, the row address generator RAP and the column address generator CAP start their operations.

Similarly to the prior art example described above, the row address generator RAP generates, in synchronism with a clock CLK, a row address having 11 bits of $R_0$–$R_{10}$ as shown in FIG. 4C. This row address signal is supplied to a fourth address formatter $FOM_4$. The fourth address formatter $FOM_4$ takes out the least significant five bits $R_0$–$R_4$ of a row address signal and the least significant six bits $A_0$–$A_5$ of a 12 bit flag address signal of $A_0$–$A_{11}$ supplied from the flag address generator FLM-AP to format an 11 bit address signal of $A_5$–$A_0 \cdot R_4$–$R_0$ as shown in FIG. 4G and supplies this address signal to the row address failure counter RFC.

The first carry detector CS1 is set, as shown in FIG. 4E, to "00000011111". Every time every bit of the least significant five bits of a row address signal outputted from the row address generator RAP becomes equal to logical "1", a carry signal is supplied to the column address generator CAP so that the address of a column address signal outputted from the column address generator CAP is incremented by 1. Further, the second carry detector CS2 is also set, as shown in FIG. 4F, to "00000011111".

The column address generator CAP outputs, as shown in FIG. 4D, an 11 bit column address signal of $C_0$–$C_{10}$. A fifth address formatter $FOM_5$ takes out the least significant five bits $C_0$–$C_4$ of this column address signal and the most significant six bits $A_6$–$A_{11}$ of a 12 bit flag address signal of $A_0$–$A_{11}$ supplied from the flag address generator FLM-AP to format an 11 bit address signal of $A_{11}$–$A_6 \cdot C_4$–$C_0$ and supplies this address signal to the column address failure counter CFC.

Further, the third address formatter $FOM_3$ takes out the least significant five bits $R_0$–$R_4$ of an 11 bit row address signal of $R_0$–$R_{10}$ shown in FIG. 4C, the least significant six bits $A_0$–$A_5$ of a 12 bit flag address signal of $A_0$–$A_{11}$ supplied from the flag address generator FLM-AP as shown in FIG. 4B, the least significant five bits $C_0$–$C_4$ of an 11 bit column address signal of $C_0$–$C_{10}$ outputted from the column address generator CAP as shown in FIG. 4D, and the most significant six bits $A_6$–$A_{11}$ of the 12 bit flag address signal of $A_0$–$A_{11}$ to format and generate a 22 bit address signal of $A_{11}$–$A_6 \cdot C_4$–$C_0 \cdot A_5$–$A_0 \cdot R_4$–$R_0$ as shown in FIG. 4A. This address signal is supplied to the memory part AFM via the first multiplexer MUX-A to access the memory part AFM.

Next, the failure relief operations in the memory testing apparatus comprising the failure analysis memory 5 and the failure relief analyzer 6 constructed as mentioned above will be explained.

As an address signal outputted from the second address formatter $FOM_2$ is incremented by 1, an address for accessing the flag memory FLM is incremented by 1. Every time a flag signal of logical "1" is read out from the flag memory FLM during the address increment operation, the contents (address area) of a memory block of the memory part AFM corresponding to the flag address from which the flag signal is read out are read out.

At this point in time, a row address signal supplied to the row address failure counter RFC from the fourth address formatter $FOM_4$ is equal to the row address of the memory under test MUT where the failure occurred. Therefore, a write command is given to the memory $M_{RFC}$ by supplying the failure data to the write clock input terminal WE of the memory $M_{RFC}$ to store the number of failure occurrences in the address being accessed.

Similarly, since the column address of the memory under test MUT where the failure occurred is supplied to the column address failure counter CFC from the fifth address formatter $FOM_5$, the number of failure occurrences is stored in the column address failure counter CFC. Similarly to the prior art example, the total number of failure occurrences is stored in the total failure counter TFC.

When the data at the last address in each of the memory blocks set in the memory part AFM is read out, both the first carry detector CS1 and the second carry detector CS2 output a logical "1", respectively. As a result, the gate G4 outputs a logical "1". This logical "1" output is supplied to respective load terminals LD of the row address generator RAP and the column address generator CAP, and to the inverting terminal of the gate G3, and also to the enable terminal EN of the flag address generator FLM-AP via the logical gate OR.

By application of the logical "1" output to respective load terminals LD of the row address generator RAP and the column address generator CAP, they are reset to their initial states. In addition, a logical "0" output is supplied to respective enable terminals EN of the row address generator RAP and the column address generator CAP from the gate G3, and hence the row address generator RAP and the column address generator CAP stop their operations for generating their address signals, respectively. Consequently, the operations for incrementing respective addresses of the memory $M_{RFC}$ and the memory $M_{CFC}$ one by one are stopped. On the other hand, since the logical "1" output is supplied to the enable terminal EN of the flag address generator FLM-AP, the flag address generator FLM-AP restarts its operation thereby restarting the operation for increasing or incrementing the flag address of the flag memory FLM one by one.

As explained above, according to the present invention, even if a memory under test has a large storage capacity, a memory testing apparatus is constructed such that a failure analysis memory having the same storage capacity as that of the memory under test is subdivided in its memory area into a plurality of memory blocks, and a flag memory having an address capacity corresponding to the number of memory blocks is provided, and wherein each time failure information is written in a memory block of the failure analysis memory, a flag of logical "1" is written in an address of the flag memory corresponding to the address of the memory block in which the failure information is written. Therefore, at the time of carrying out the failure relief analysis for a tested memory, it is sufficient to read out only the contents of one or more memory blocks corresponding to one or more flag addresses in each of which a flag of logical "1" has been written.

In the embodiment mentioned above, in case the memory capacity of each of the memory under test and the failure analysis memory is 4M bits, the address capacity of the flag memory FLM is set to 4096. As a result, the address capacity of each of the memory blocks can be limited to 1024 ($2^5 \times 2^5$) addresses. Therefore, the less the number of the memory blocks in each of which failure information is written, the shorter the process of computing the classified total of the failure data for failure relief can be completed.

For example, if no failure occurs at all, only the contents of the flag memory are read out, and the contents of any one of the memory blocks in the failure analysis memory 5 need not be read out at all. Consequently, the relief process can be completed in extremely short time period. Also, in case that a flag of logical "1" has been written in only one address of the flag memory FLM, the contents of only one memory block is read out. Therefore, it suffices to access only the address area of 1024 addresses of the one memory block. Consequently, 4M (4194304) addresses can be compressed to 1024 addresses, and hence the counting of failure data can be performed at a speed or rate of 4096 (4194304÷1024) times.

In testing memories, the number of failure occurrences is different from one memory to another memory. If it is assumed that flags each having logical "1" have been written in 1/10 (10%) of the memory area of the flag memory FLM in average, there is obtained a remarkable advantage that the testing speed can be increased by about ten times according to the present invention.

Further, it is needless to say that the storage capacity of the memory to be tested and the failure analysis memory, the number of subdivided memory blocks, the storage capacity of the flag memory or the like are not limited to the values shown in the above embodiment. For example, the more the storage capacity (the number of addresses) of the flag memory is increased, the more the number of subdivided memory blocks is increased. Consequently, the storage capacity (the number of addresses) of one memory block is decreased and hence the efficiency of computing process becomes higher. Therefore, it is preferred that the storage capacity of the flag memory is larger, but it is appropriate that the flag memory has its storage capacity (the number of addresses) between one in several tens (1/several tens) and one in several thousand (1/several thousand) of that of the failure analysis memory.

What is claimed is:

1. A memory testing apparatus comprising:

a failure analysis memory having the same storage capacity as that of a memory under test, and being accessed by the same address signal as that which is applied to the memory under test, said failure analysis memory storing, each time a failure memory cell is detected from the memory under test, failure memory cell information written at the same address of said failure analysis memory as that of the memory under test in which that failure memory cell resides; and a failure relief analyzer for accessing all of the addresses of said failure analysis memory to read out the stored failure memory cell information therefrom after completion of the test, and computing position information in which the failure memory cell or cells reside and the total number of the failure memory cells, thereby to determine whether the relief of the tested memory is possible or not on the basis of the position information and the total number of the failure memory cells, said memory testing apparatus being characterized by:

means for subdividing said failure analysis memory into a plurality of memory blocks;

a flag memory having its addresses corresponding to the subdivided memory blocks respectively, and storing at an address thereof corresponding to a memory block a flag representing that failure memory cell information has been written in that memory block;

address formatting means for taking out several bits from an address signal applied to said failure analysis memory, thereby to create an address signal for accessing all of the addresses of said flag memory, when testing a memory under test; and computing means for accessing all of the addresses of said flag memory to read out the stored flag therefrom after completion of the test, and reading out only the stored contents of one or more memory blocks of said failure analysis memory corresponding to the address or addresses of the read-out one or more flags to compute position information of the failure memory cell or cells.

2. The memory testing apparatus according to claim 1, wherein said computing means comprises:

a row address generator for generating the same row address signal as a row address signal of an address signal applied to said failure analysis memory;

a column address generator for generating the same column address signal as a column address signal of the address signal applied to said failure analysis memory;

a flag address generator for generating a flag address signal for accessing all of the addresses of said flag memory after completion of the test;

second address formatting means for creating an address signal for accessing all of the addresses of one or more memory blocks corresponding to the address or addresses of one or more flags read out from said flag memory on the basis of the output signals from said flag address generator, said row address generator and said column address generator;

row failure cell storage means for storing therein the failure memory cell information relating to row addresses of failure memory cell information read out, after completion of the test, from one or more memory blocks in which failure memory cell information has been written;

column failure cell storage means for storing therein the failure memory cell information relating to column addresses of the failure memory cell information read out, after completion of the test, from said one or more memory blocks in which failure memory cell information has been written;

third address formatting means for creating an address signal for accessing all of the addresses of said row failure cell storage means on the basis of the output signals from said flag address generator and said row address generator; and fourth address formatting means for creating an address signal for accessing all of the addresses of said column failure cell storage means on the basis of the output signals from said flag address generator and said column address generator.

3. The memory testing apparatus according to claim 1, further including:

means for storing therein the total number of failure memory cells read out from one or more memory blocks in which failure memory cell information has been written.

4. The memory testing apparatus according to claim 2, further including:

means for storing therein the total number of failure memory cells read out from one or more memory blocks in which failure memory cell information has been written.

5. The memory testing apparatus according to claim 1, wherein said flag memory is arranged such that at the time of testing a memory under test, it is accessed by an address signal created by said address formatting means whereby a logical value representing a flag is written at an address of said flag memory being accessed by said address signal each time failure cell information is written in said failure analysis memory.

6. The memory testing apparatus according to claim 1, wherein the storage capacity of said flag memory is selected between one in several tens (1/several tens) and one in several thousand (1/several thousand) of that of said failure analysis memory.

7. The memory testing apparatus according to claim 1, wherein said address formatting means takes out most significant several bits from a row address signal and most significant several bits from a column address signal of an address signal applied to said failure analysis memory, respectively, thereby to create an address signal for accessing all of the addresses of said flag memory.

* * * * *